(12) United States Patent
Liao et al.

(10) Patent No.: US 8,247,305 B2
(45) Date of Patent: Aug. 21, 2012

(54) METHOD AND RESULTING STRUCTURE FOR DEEP TRENCH POLYSILICON HARD MASK REMOVAL

(75) Inventors: Kuo-Chang Liao, Shanghai (CN); Weijun Song, Shanghai (CN); Dang Quan Liao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/960,357

(22) Filed: Dec. 3, 2010
(Under 37 CFR 1.47)

(65) Prior Publication Data
US 2012/0129314 A1    May 24, 2012

(30) Foreign Application Priority Data

Dec. 4, 2009 (CN) .......................... 2009 1 0200000

(51) Int. Cl.
*H01L 21/331* (2006.01)
(52) U.S. Cl. ........ 438/386; 438/243; 438/248; 438/387; 438/391; 438/392; 438/399; 438/700; 438/703; 438/717; 438/738; 257/301; 257/E27.092; 257/E27.095; 257/E29.346; 257/E21.396; 257/E21.548; 257/E21.553
(58) Field of Classification Search .......................... None
See application file for complete search history.

(56) References Cited

U.S. PATENT DOCUMENTS 6,696,365 B2 * 2/2004 Kumar et al. ................ 438/706

FOREIGN PATENT DOCUMENTS

CN        1229277 A     9/1999

* cited by examiner

*Primary Examiner* — Charles Garber
*Assistant Examiner* — Yasser Abdelaziez
(74) *Attorney, Agent, or Firm* — Kilpatrick Townsend and Stockton LLP

(57) ABSTRACT

A method of forming a capacitor structure includes forming a pad oxide layer overlying a substrate, a nitride layer overlying the pad oxide layer, an interlayer dielectric layer overlying the nitride layer, and a patterned polysilicon mask layer overlying the interlayer dielectric layer. The method then applies a first RIE process to form a trench region through a portion of the interlayer dielectric layer using the patterned polysilicon mask layer and maintaining the first RIE to etch through a portion of the nitride layer and through a portion of the pad oxide layer. The method stops the first RIE when a portion of the substrate has been exposed. The method then forms an oxide layer overlying the exposed portion of the substrate and applies a second RIE process to continue to form the trench region by removing the oxide layer and removing a portion of the substrate to a predetermined depth.

18 Claims, 3 Drawing Sheets

METHOD AND RESULTING STRUCTURE FOR DEEP TRENCH POLYSILICON HARD MASK REMOVAL

CROSS-REFERENCES TO RELATED APPLICATIONS

This application claims priority to Chinese Patent No. 200910200000.5, filed Dec. 4, 2009, which is commonly owned and incorporated by reference herein for all purposes.

BACKGROUND OF THE INVENTION

Embodiments of the present invention are directed to integrated circuits and their processing for the manufacture of semiconductor devices. More particularly, embodiments of the invention provide a method and structures for manufacturing a capacitor structure for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, conventional techniques and materials present certain process limitations.

An example of such a process is the manufacture of capacitor structures for memory devices. Such capacitor structures include, among others, trench designs, stack designs, and others. Although there have been significant improvements, such designs still have many limitations. As merely an example, these designs must become smaller and smaller but still provide high capacitance values and low leakage characteristics. Additionally, these capacitor designs are often difficult to manufacture and generally require complex manufacturing processes and structures. These and other limitations will be described in further detail throughout the present specification and more particularly below.

From the above, it is seen that an improved technique for processing semiconductor devices is desired.

SUMMARY OF THE INVENTION

According to embodiments of the present invention, techniques for processing integrated circuits for the manufacture of semiconductor devices are provided. More particularly, embodiments of the present invention provide a method and structures for manufacturing a capacitor structure for dynamic random access memory devices, commonly called DRAMs. But it would be recognized that the invention has a much broader range of applicability.

A specific embodiment of the present invention provides a method of forming a capacitor structure for a dynamic random access memory integrated circuit. The method includes providing a semiconductor substrate, e.g., silicon wafer. The method includes forming a pad oxide layer (e.g., silicon oxide) overlying the semiconductor substrate. The method includes forming a nitride layer overlying the pad oxide layer and forming an interlayer dielectric layer overlying the nitride layer. The method includes forming a polysilicon mask layer overlying the interlayer dielectric layer and patterning the polysilicon mask layer to form an opening therein for a trench structure. The method includes applying a first reactive ion etching process to form a first trench region through a portion of the interlayer dielectric layer using the patterned polysilicon mask layer and maintaining the first reactive ion etching process to etch through a portion of the nitride layer and through a portion of the pad oxide layer. The method includes ceasing the first reactive ion etching process when a surface region of the semiconductor substrate has been exposed. The method also includes forming an oxide layer overlying at least the exposed surface region of the semiconductor substrate to protect the exposed surface region of the semiconductor substrate and removing the patterned polysilicon mask material while protecting the surface region of the semiconductor substrate using the oxide layer. The method applies a second reactive ion etching process to continue to form a second trench region by removing the oxide layer and removing a portion of the semiconductor substrate to a predetermined depth in the semiconductor substrate, wherein the second trench region is an extension of the first trench region into the semiconductor substrate.

An alternative specific embodiment of the present invention provides a method of forming a capacitor structure for a dynamic random access memory integrated circuit. The method includes providing a semiconductor substrate, e.g., silicon wafer. The method includes forming a pad layer (e.g., silicon oxide) overlying the semiconductor substrate. The method includes forming a nitride layer overlying the pad layer and forming an interlayer dielectric layer overlying the nitride layer. The method includes forming a polysilicon mask layer overlying the interlayer dielectric layer and patterning the polysilicon mask layer to form an opening therein for a trench structure. The method includes applying a first reactive ion etching process to form a trench region through a portion of the interlayer dielectric layer while using the patterned polysilicon mask layer and maintaining the reactive ion etching process to etch through a portion of the nitride layer and through a portion of the pad oxide layer. The method includes ceasing the reactive ion etching process when a surface region of the semiconductor substrate has been exposed. The method includes forming an oxide layer overlying at least the exposed surface region of the semiconductor substrate to protect the surface region of the substrate. Preferably, the oxide layer is less than 50 Angstroms or less than 30 Angstroms. The method includes removing the patterned polysilicon mask material while protecting the surface region of the semiconductor substrate using the oxide layer. The method applies a second reactive ion etching process to continue to form the trench region by removing the oxide layer and removing a portion of the semiconductor substrate to a predetermined depth in the semiconductor substrate. The method further includes forming a lower electrode plate overlying the trench region, forming a dielectric layer overlying the lower electrode plate, and forming an upper electrode plate overlying the dielectric layer to complete the capacitor structure.

Embodiments of the present invention provide many benefits over conventional techniques. For example, the present technique provides an easy to use process that relies upon conventional technology. Embodiments of the present invention provide higher device yields in dies per wafer. Additionally, the embodiments of the present invention provide a process that is compatible with conventional process technology without substantial modifications to conventional equipment and processes. Preferably, the invention provides for improved process integration for design rules of 0.13 microns and less. Additionally, embodiments of the invention provide capacitor structures having improved characteristics. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

DETAILED DESCRIPTION OF THE INVENTION

Figure 1:
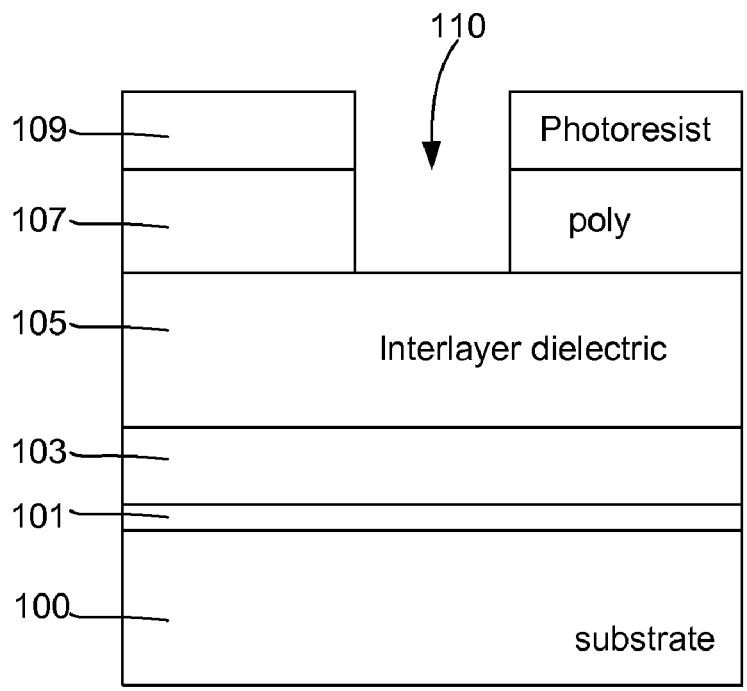
FIGS. 1 through 6 are simplified cross-sectional view diagrams illustrating a method for forming a capacitor structure according to an embodiment of the present invention.

Embodiments of the present invention provide techniques of processing integrated circuits for the manufacture of semiconductor devices. More particularly, embodiments of the invention provides a method and structures for manufacturing a capacitor structure for dynamic random access memory devices, commonly called DRAMs. Merely by way of example, embodiments of the invention have been applied to the formation of a capacitor structure for a dynamic random access memory device, but it would be recognized that the invention has a much broader range of applicability.

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

A method for fabricating a capacitor structure for a dynamic random access memory device according to an embodiment of the present invention may be outlined as follows:

1. Provide a semiconductor substrate, e.g., silicon wafer;
2. Form a pad oxide layer (e.g., silicon oxide) overlying the semiconductor substrate;
3. Form a nitride layer overlying the pad oxide layer;
4. Form an interlayer dielectric layer overlying the nitride layer;
5. Form a polysilicon mask layer overlying the interlayer dielectric layer;
6. Pattern the polysilicon mask layer to form an opening therein for a trench structure;
7. Apply a first reactive ion etching process to form a trench region through a portion of the interlayer dielectric layer while using the patterned polysilicon mask layer;
8. Maintain the reactive ion etching process to etch through a portion of the nitride layer and through a portion of the pad oxide layer;
9. Cease the first reactive ion etching process when a portion of the semiconductor substrate has been exposed;
10. Form an oxide layer overlying the portion of the semiconductor substrate to protect the portion of the substrate;
11. Remove the patterned polysilicon mask material while protecting the portion of the semiconductor substrate using the oxide layer;
12. Apply a second reactive ion etching process to continue to form a trench region by removing the oxide layer, and remove a portion of the semiconductor substrate to a predetermined depth in the semiconductor substrate;
13. Form a lower electrode plate on a surface area of the trench region, a dielectric layer overlying the lower electrode plate, and an upper electrode plate overlying the dielectric layer to complete a capacitor structure; and
14. Perform other steps, as desired.

The above sequence of steps provides a method according to an embodiment of the present invention. As shown, the method uses a combination of steps including a way of forming a capacitor structure for a dynamic random access memory device. Other alternatives can also be provided where steps are added, one or more steps are removed, or one or more steps are provided in a different sequence without departing from the scope of the claims herein. Further details of the invention can be found throughout the present specification and more particularly below.

FIGS. 1 through 6 are simplified cross-sectional view diagrams illustrating a method of forming a capacitor structure according to an embodiment of the present invention. These diagrams are merely examples, which should not unduly limit the scope of the claims herein. One of ordinary skill in the art would recognize many variations, alternatives, and modifications. As shown in FIG. 1, the method includes providing a semiconductor substrate 100, e.g., silicon wafer, silicon on insulator (step 1). The method includes forming a pad oxide layer 101 (e.g., silicon oxide, silicon oxide nitride) overlying the semiconductor substrate (step 2). The method includes forming a nitride layer 103 overlying the pad oxide layer (step 3). Preferably, the nitride layer is silicon nitride or other suitable material. The method includes forming an interlayer dielectric layer 105 overlying the nitride layer (step 4). The interlayer dielectric material can be a suitable material such as PSG (phosphosilicate glass), BPSG (borophosphosilicate glass), FSG (fluorinated silicon glass), or the like. The method includes forming a polysilicon mask layer 107 overlying the interlayer dielectric layer (step 5) and patterning the polysilicon mask layer to form an opening therein 110 for a trench structure (step 6). Preferably, the masking is performed using a photolithography process with a photoresist material 109. In an embodiment, the opening has a width of about 0.15 micron and less.

Figure 2:
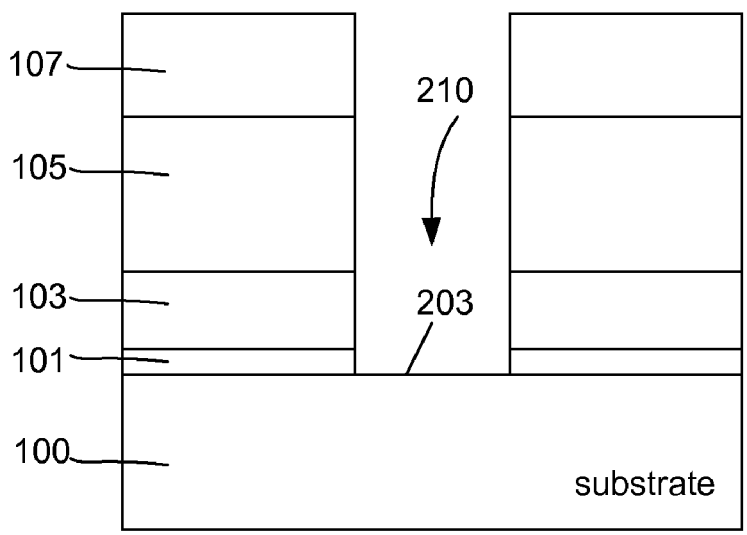

Referring to FIG. 2, the method includes applying a first reactive ion etching process to form a first trench region 210 through a portion of the interlayer dielectric layer using the patterned polysilicon mask layer (step 7). The method maintains the first reactive ion etching process to etch through a portion of the nitride layer and through a portion of the pad oxide layer. Preferably, the etching process exposes a surface region 203 of the silicon substrate. The etching process may use suitable etchants such as $C_4F_8$ and $C_3F_6$ species, but other etchants may also be used.

Figure 3:
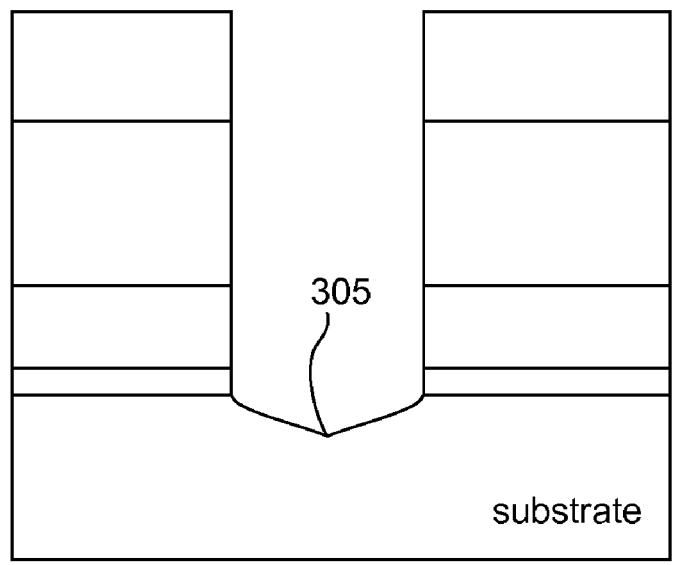

According to embodiments of the invention, if the etching process continued, as shown in FIG. 3, a damage 305 may occur to the silicon substrate. The damage is of a mechanical nature and may often lead to poorly formed trench structures that affect the reliability and performance of a device. Accordingly, the method ceases the first reactive ion etching process when a portion of the semiconductor substrate has been exposed (step 9). In an embodiment, an end point detection process is used to signal the completion of the first etching process.

Figure 4:
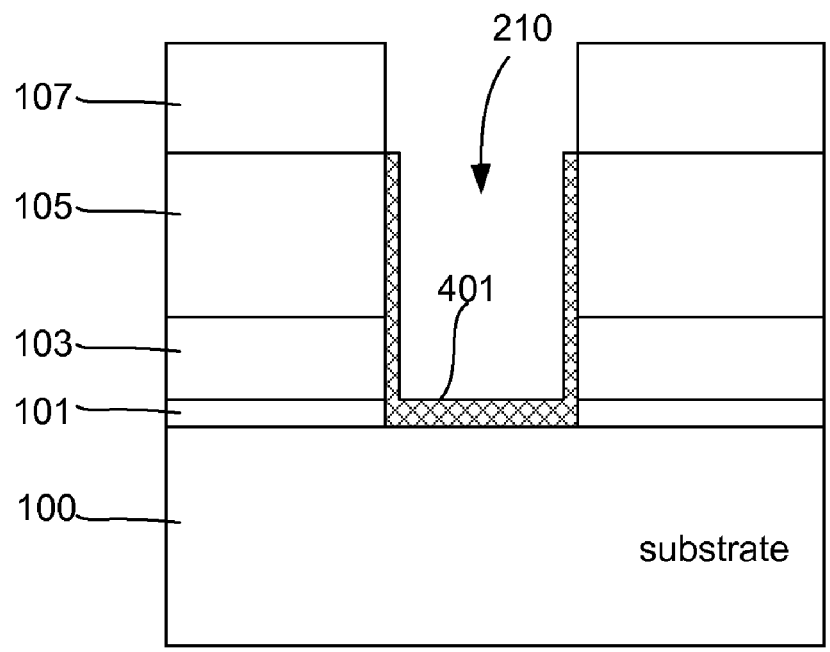

The method further includes forming an oxide layer 401 overlying the trench 210 and the exposed portion 203 of the semiconductor substrate to protect the exposed portion of the semiconductor substrate (step 10), as illustrated in FIG. 4. The method also includes removing the patterned polysilicon mask material while protecting the exposed portion of the semiconductor substrate using the oxide layer. In an embodiment, the oxide layer is formed using an $O_2$ bearing gas species, which has been applied at low temperature of about 270 degrees Celsius and less. The oxide layer is often thin and is less than 35 Angstroms. Here, the oxide layer has to be sufficiently thick to protect the silicon substrate but has also to be sufficiently thin so that it can be punched through in a subsequent etching process. In a specific embodiment, the thickness of the oxide layer may range from about 25 Angstroms to less than 35 Angstrom, preferably, about 30 Angstroms and less. If the thickness of the oxide layer is too thick, it won't be etched through. And if it is too thin, it won't provide sufficient protection for the substrate that may be damaged during the removal of the patterned polysilicon mask (step 11). Thus, through the oxide layer, the silicon substrate will not be damaged and is free from imperfections or the like during the first reactive ion etching process.

Figure 5:
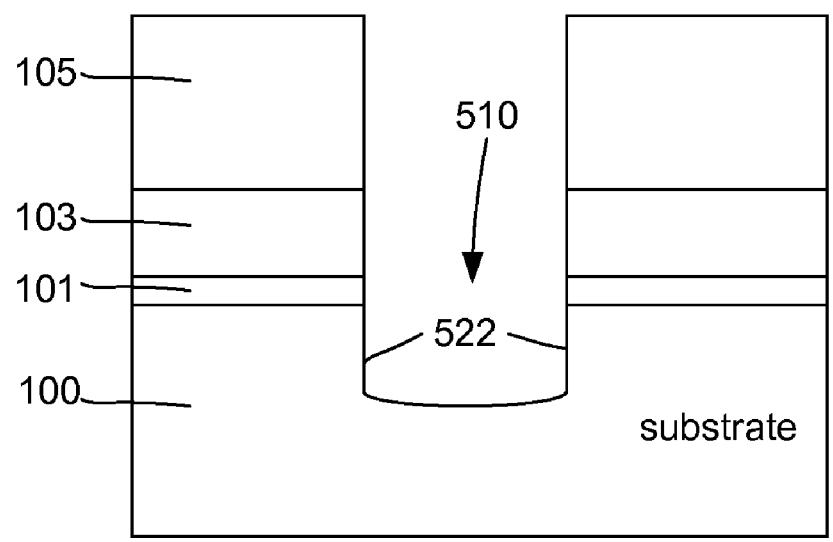

Referring to FIG. 5, the method applies a second reactive ion etching process to continue to form a second trench region 510 by removing the oxide layer and removing a portion of the semiconductor substrate to a predetermined depth in the semiconductor substrate (step 12). It is noted that the second reaction ion etching (RIE) process differs from the first reaction ion etching process as the second RIE process uses $CHF_3$ as an etchant. In an alternative embodiment, the second reactive ion etching process may use $HF_3$ and HBr bearing species or other like species. It is appreciated that the second RIE not only does not cause mechanical damage to the trench region of the semiconductor substrate, but also produces the second trench region having a hard surface and substantially vertical sidewalls 522 that are free from mechanical imperfections.

Figure 6:
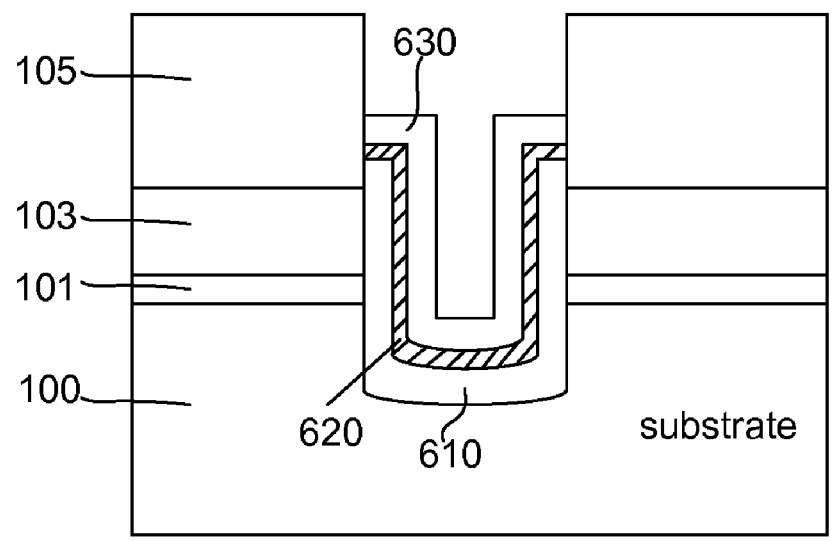

Referring to FIG. 6, the method further forms a lower electrode plate 610 overlying at least a portion of the first trench region and the entire second trench region including the surface area of sidewalls 522. In an embodiment, the lower electrode plate can be in-situ doped with a phosphorous species. In another embodiment, the method forms an arsenic-doped polysilicon layer overlying a surface area of the first and second trench regions. The method further removes a portion of the doped polysilicon layer and performs an annealing process to allow the arsenic to diffuse. In yet another embodiment, the method may form hemispherical grain silicon on the lower electrode plate to increase its surface area. The method then forms a dielectric layer 620 overlying the lower electrode plate. In an embodiment, the dielectric layer has a high dielectric constant. In a specific embodiment, the dielectric layer includes a silicon nitride material that has a dielectric constant of about 7. The high dielectric constant of the dielectric layer can increase the per area charge storage of a capacitor. The method then forms an upper electrode 630 overlying the dielectric layer to complete a capacitor structure (step 13). In a specific embodiment, the upper capacitor plate is preferably polysilicon such as in-situ doped polysilicon or other like materials. Of course, one of ordinary skill in the art would recognize other variations, modifications, and alternatives.

Referring back to FIG. 5, the trench region within the interlayer dielectric layer may have a depth of about 2 microns and greater and a width of 0.15 micron according to an embodiment of the present invention. The trench region through the interlayer dielectric layer and through the portion of the semiconductor substrate may have a length of 8 microns and greater in a specific embodiment. Of course, there can be other variations, modifications, and alternatives.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a capacitor structure for a dynamic random access memory integrated circuit, the method comprising:
   providing a semiconductor substrate;
   forming a pad oxide layer overlying the semiconductor substrate;
   forming a nitride layer overlying the pad oxide layer;
   forming an interlayer dielectric layer overlying the nitride layer;
   forming a polysilicon mask layer overlying the interlayer dielectric layer;
   patterning the polysilicon mask layer to form an opening therein for a trench structure;
   applying a first reactive ion etching process to form a first trench region through a portion of the interlayer dielectric layer using the patterned polysilicon mask layer;
   maintaining the first reactive ion etching process to etch through a portion of the nitride layer and through a portion of the pad oxide layer;
   ceasing the first reactive ion etching process when a surface region of the semiconductor substrate has been exposed;
   forming an oxide layer overlying the surface region of the semiconductor substrate to protect the surface region of the semiconductor substrate;
   removing the patterned polysilicon mask layer while protecting the surface region of the semiconductor substrate using the oxide layer;
   applying a second reactive ion etching process to continue to form a second trench region by removing the oxide layer and removing a portion of the semiconductor substrate to a predetermined depth in the semiconductor substrate;
   forming a lower electrode plate overlying at least a portion of the first trench region and the entire second trench region;
   forming a dielectric layer overlying the lower electrode plate; and
   forming an upper electrode plate to complete the capacitor structure.

2. The method of claim 1 wherein the forming an oxide layer comprises the use of an $O_2$ bearing gas species at about 270 degrees Celsius.

3. The method of claim 2 wherein the oxide layer comprises a thickness of 30 Angstroms and less.

4. The method of claim 1 wherein the trench region within the interlayer dielectric layer comprises a width of 0.15 micron and a depth of about 2 microns and more.

5. The method of claim 4 wherein the trench region through the interlayer dielectric layer and through the portion of the semiconductor substrate comprises a length of 8 microns and more.

6. The method of claim 1 wherein the first reactive ion etching process uses $C_4F_8$ and $C_3F_6$ species.

7. The method of claim 1 wherein the second reactive ion etching process uses HF3 and HBr bearing species.

8. The method of claim 1 further comprising a wet cleaning process after ceasing the first reactive ion etching process and before forming the oxide layer.

9. The method of claim 1 further comprising forming a bottom electrode to line an interior region of the trench structure.

10. The method of claim 1 wherein the oxide layer comprises a silicon dioxide material.

11. The method of claim 1 wherein the second trench region in the semiconductor substrate is free from a mechanical damage.

12. The method of claim 1 wherein the second trench region comprises sidewalls that are substantially vertical.

13. The method of claim 1 wherein the second trench region is free from mechanical imperfections.

14. The method of claim 1 wherein the forming a lower electrode plate comprising in-situ doping with a phosphorous species.

15. The method of claim 1 wherein the dielectric layer comprises a silicon nitride material having a dielectric constant of about 7.

16. The method of claim 1 further comprising:
forming a polysilicon layer over the first and second trench regions, the polysilicon layer being doped with an arsenic species; and
diffusing the arsenic species through annealing.

17. The method of claim 1 further comprising providing a hemispherical grain silicon layer overlying the lower electrode plate.

18. The method of claim 1 wherein the ceasing the first reactive ion etching process comprises an end point detection process.

* * * * *